US012237252B2

(12) United States Patent
Jeon et al.

(10) Patent No.: US 12,237,252 B2
(45) Date of Patent: Feb. 25, 2025

(54) SEMICONDUCTOR PACKAGE

(71) Applicant: Samsung Electronics Co., Ltd., Suwon-si (KR)

(72) Inventors: Yoonyoung Jeon, Cheonan-si (KR); Joonseok Oh, Seoul (KR); Youngmin Kim, Yongin-si (KR); Dongheon Kang, Busan (KR); Changbo Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 399 days.

(21) Appl. No.: 17/672,092

(22) Filed: Feb. 15, 2022

(65) Prior Publication Data

US 2022/0399260 A1 Dec. 15, 2022

(30) Foreign Application Priority Data

Jun. 14, 2021 (KR) .................. 10-2021-0077001

(51) Int. Cl.
*H01L 23/498* (2006.01)
*H01L 23/00* (2006.01)
(Continued)

(52) U.S. Cl.
CPC .. *H01L 23/49822* (2013.01); *H01L 23/49816* (2013.01); *H01L 23/49838* (2013.01); *H01L 24/08* (2013.01); *H01L 24/16* (2013.01); *H01L 24/32* (2013.01); *H01L 24/73* (2013.01); *H01L 25/0655* (2013.01); *H01L 25/105* (2013.01); *H01L 2224/08235* (2013.01); *H01L 2224/16227* (2013.01); *H01L 2224/16235* (2013.01); *H01L 2224/32225* (2013.01); *H01L 2224/73204* (2013.01); *H01L 2225/1023* (2013.01);
(Continued)

(58) Field of Classification Search
CPC ......... H01L 24/08; H01L 24/16; H01L 24/32; H01L 24/73; H01L 25/0655
USPC ............................................. 257/35
See application file for complete search history.

(56) References Cited

U.S. PATENT DOCUMENTS

2019/0333862 A1   10/2019  Wang et al.
2020/0381325 A1   12/2020  Huang et al.
(Continued)

FOREIGN PATENT DOCUMENTS

| JP | 2019-117865 A | 7/2019 |
| KR | 10-1757579 B1 | 7/2017 |
| KR | 10-2021-0015071 A | 2/2021 |

*Primary Examiner* — Jasmine J Clark
(74) *Attorney, Agent, or Firm* — Harness, Dickey & Pierce, P.L.C.

(57) ABSTRACT

A semiconductor package may include at least one first rewiring structure, the at least one first rewiring structure including a plurality of first insulating layers vertically stacked and a plurality of first rewiring patterns included in the plurality of first insulating layers, at least one semiconductor chip on the at least one first rewiring structure, and at least one molding layer covering the at least one semiconductor chip, wherein each of the plurality of first rewiring patterns includes, a first conductive pattern, the first conductive pattern including a curved upper surface, and a first seed pattern covering a side surface and a lower surface of the first conductive pattern, and each of the first seed patterns of the plurality of first rewiring patterns having a same shape.

20 Claims, 12 Drawing Sheets

(51) Int. Cl.
*H01L 25/065* (2023.01)
*H01L 25/10* (2006.01)

(52) U.S. Cl.
CPC ............. *H01L 2225/1058* (2013.01); *H01L 2924/15174* (2013.01)

(56) References Cited

U.S. PATENT DOCUMENTS

2020/0411458 A1* 12/2020 Kim .................. H01L 23/49816
2021/0028095 A1    1/2021 Kuo et al.
2021/0035878 A1    2/2021 Jin et al.
2021/0305189 A1*  9/2021 Jin ...................... H01L 23/5226

* cited by examiner

SEMICONDUCTOR PACKAGE

CROSS-REFERENCE TO RELATED APPLICATION

This U.S. non-provisional application is based on and claims the benefit of priority under 35 U.S.C. § 119 to Korean Patent Application No. 10-2021-0077001, filed on Jun. 14, 2021, in the Korean Intellectual Property Office, the disclosure of which is incorporated by reference herein in its entirety.

BACKGROUND

Various example embodiments of the inventive concepts relate to a semiconductor package, and more particularly, to a fan-out semiconductor package, and/or a method of manufacturing a fan-out semiconductor package, etc.

Recently, due to a significant increase in demand for electronic products, miniaturization and weight reduction of electronic components mounted in the electronic products have been desired and/or required. Thus, the size of a semiconductor package mounted in the electronic components has been decreased. Simultaneously, logic chips, memory chips, etc. included in the semiconductor package have been processing data of a large capacity. Accordingly, the number of input/output (I/O) terminals of a semiconductor chip has greatly increased, and a distance between the I/O terminals has decreased, which has caused interference between the I/O terminals. In order to alleviate the interference between the I/O terminals, a fan-out semiconductor package configured to increase a distance between I/O terminals has been used.

SUMMARY

Various example embodiments of the inventive concepts provide a semiconductor package having increased reliability and/or a method of manufacturing the semiconductor package having increased reliability.

According to at least one example embodiment of the inventive concepts, there is provided a semiconductor package. The semiconductor package includes at least one first rewiring structure, the at least one first rewiring structure including a plurality of first insulating layers vertically stacked and a plurality of first rewiring patterns included in the plurality of first insulating layers, at least one semiconductor chip on the at least one first rewiring structure, at least one molding layer covering the at least one semiconductor chip, wherein each of the plurality of first rewiring patterns includes, a first conductive pattern, the first conductive pattern including a curved upper surface, and a first seed pattern covering a side surface and a lower surface of the first conductive pattern, and each of the first seed patterns of the plurality of first rewiring patterns having a same shape.

According to at least one example embodiment of the inventive concepts, there is provided a semiconductor package. The semiconductor package includes at least one first rewiring structure including a plurality of first insulating layers stacked in a first direction and a plurality of first rewiring patterns included in the plurality of first insulating layers, at least one semiconductor chip on the at least one first rewiring structure, at least one second rewiring structure apart from the first rewiring structure in the first direction with the at least one semiconductor chip therebetween, the at least one second rewiring structure including a plurality of second insulating layers stacked in the first direction and a plurality of second rewiring patterns included in the plurality of second insulating layers, and each of the plurality of second rewiring patterns includes, at least one second conductive pattern, and at least one second seed pattern covering a side surface and a lower surface of the second conductive pattern, each of the at least one second seed patterns having a same shape, and the at least one second seed pattern including a curved upper surface.

According to at least one example embodiment of the inventive concepts, there is provided a semiconductor package. The semiconductor package includes a plurality of first through third insulating layers sequentially stacked in a first direction, a plurality of first rewiring patterns, each of the plurality of first rewiring patterns including a first via portion and a first trace portion, the first via portion arranged through the first insulating layer in the first direction, and the first trace portion on the respective first insulating layer, a plurality of second rewiring patterns, the plurality of second rewiring patterns each including a second via portion and a second trace portion, the second via portion arranged through the second insulating layer in the first direction, and the second trace portion on the respective second insulating layer, a plurality of third rewiring patterns each including a third via portion connected to the second trace portion through the third insulating layer, and a third trace portion on the third insulating layer, and at least one semiconductor chip electrically connected to at least one of the plurality of third rewiring patterns, wherein each of the first rewiring patterns includes a first conductive pattern, the first conductive pattern including a concave upper surface, and a first seed pattern covering a side surface and a lower surface of the first conductive pattern, each of the first seed patterns having a same shape, each of the second rewiring patterns includes a second conductive pattern, the second conductive pattern including a concave upper surface, and a second seed pattern covering a side surface and a lower surface of the second conductive pattern, each of the second seed patterns having a same shape, and each of the third rewiring patterns includes, a third conductive pattern, the third conductive pattern including a concave upper surface, and a third seed pattern covering a side surface and a lower surface of the third conductive pattern, each of the third seed patterns having a same shape.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Figure 1:
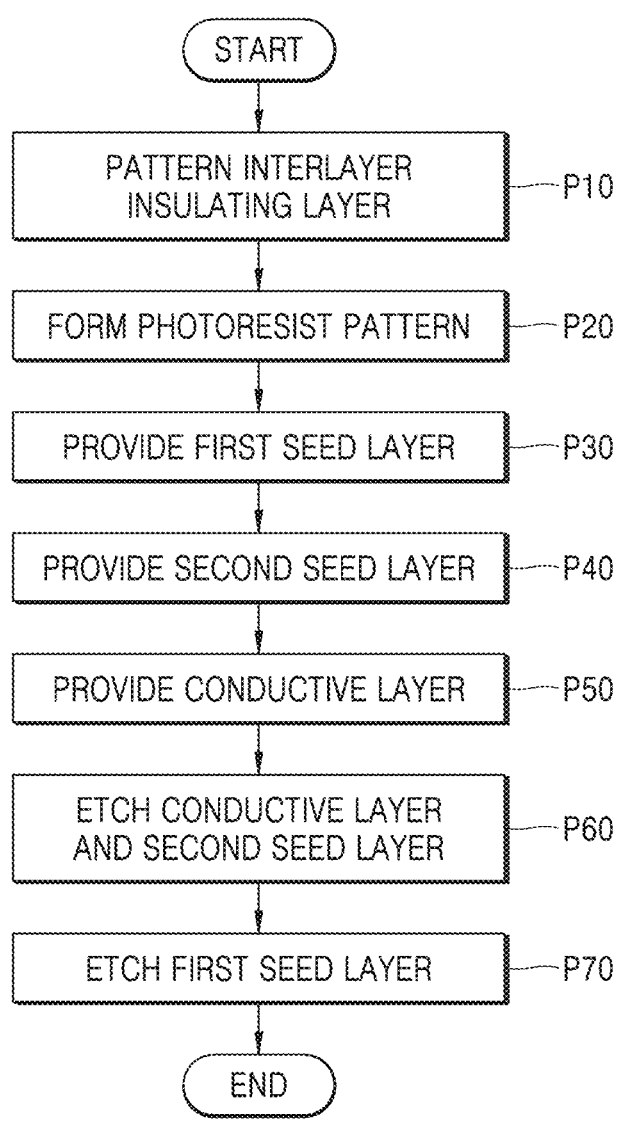
FIG. 1 is a flowchart of a method of manufacturing a semiconductor package, according to some example embodiments.

Hereinafter, various example embodiments of the inventive concepts are described in detail with reference to the accompanying drawings. For the same components on the drawings, the same reference numerals are used, and the same descriptions are not given.

FIG. 1 is a flowchart of a method of manufacturing a semiconductor package, according to some example embodiments.

FIGS. 2 through 9 are cross-sectional views of a method of manufacturing a semiconductor package, according to some example embodiments.

Figure 2:
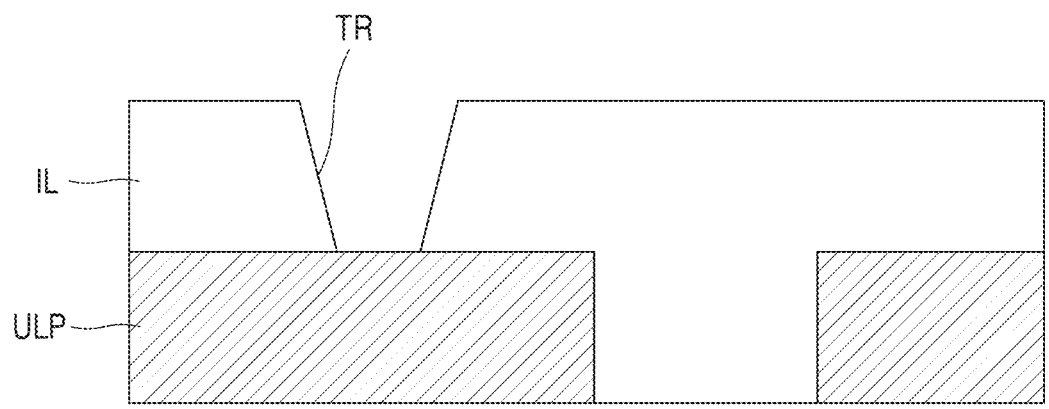
FIGS. 2 through 9 are cross-sectional views of a method of manufacturing a semiconductor package, according to some example embodiments.

Referring to FIGS. 1 and 2, at least one interlayer insulating layer IL may be patterned in operation P10 according to some example embodiments. The interlayer insulating layer IL may be arranged on underlying patterns ULP, but the example embodiments are not limited thereto. By patterning the interlayer insulating layer IL, at least one trench TR partially exposing an upper surface of the underlying patterns ULP may be formed, but the example embodiments are not limited thereto.

According to some example embodiments, the underlying patterns ULP may include a metal, such as Cu, Al, W, Ti, Ta, In, Mo, Mn, Co, Sn, Ni, Mg, Re, Be, Ga, Ru, etc., and/or an alloy thereof, but are not limited thereto, and other metals may be used.

According to at least one example embodiment, the interlayer insulating layer IL may include, for example, at least one photo imageable dielectric (PID) material, on which a lithography process may be performed, but is not limited thereto. For example, the interlayer insulating layer IL may include, for example, photosensitive polyimide (PSPI), etc., but the example embodiments are not limited thereto. The interlayer insulating layer IL may also include silicon oxide, silicon nitride, etc., but is not limited thereto. When the interlayer insulating layer IL includes a PID material, the interlayer insulating layer IL may be patterned without forming an additional photoresist layer thereon, etc. Here, the lithography process refers to a process of transferring, onto an object layer, a circuit pattern pre-formed on a photomask, etc., through exposure and development, etc. The interlayer insulating layer IL may cover at least one of a portion of an upper surface and/or a portion of a side surface of the underlying patterns ULP, etc.

Figure 3:
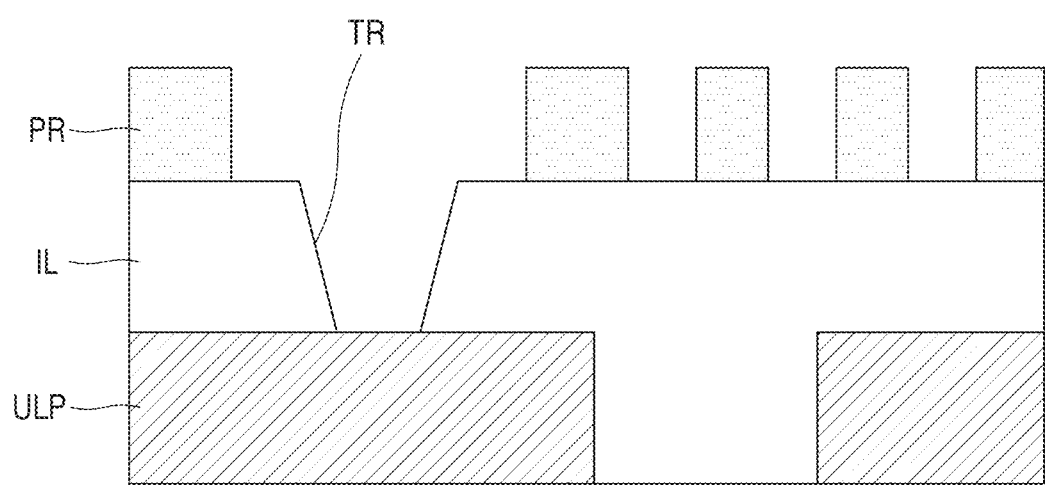

Referring to FIGS. 1 and 3, at least one photoresist pattern PR may be provided on the interlayer insulating layer IL in operation P20, but the example embodiments are not limited thereto. According to some example embodiments, the photoresist pattern PR may be provided before an additional seed layer is formed on the interlayer insulating layer IL, but the example embodiments are not limited thereto. Accordingly, the photoresist pattern PR may contact the interlayer insulating layer IL, etc.

After coating a photoresist layer on the interlayer insulating layer IL, a portion of the photoresist layer, the portion being exposed (or not exposed if a negative photoresist is used) through exposure and development may be removed to form the photoresist pattern PR, etc.

Figure 4:
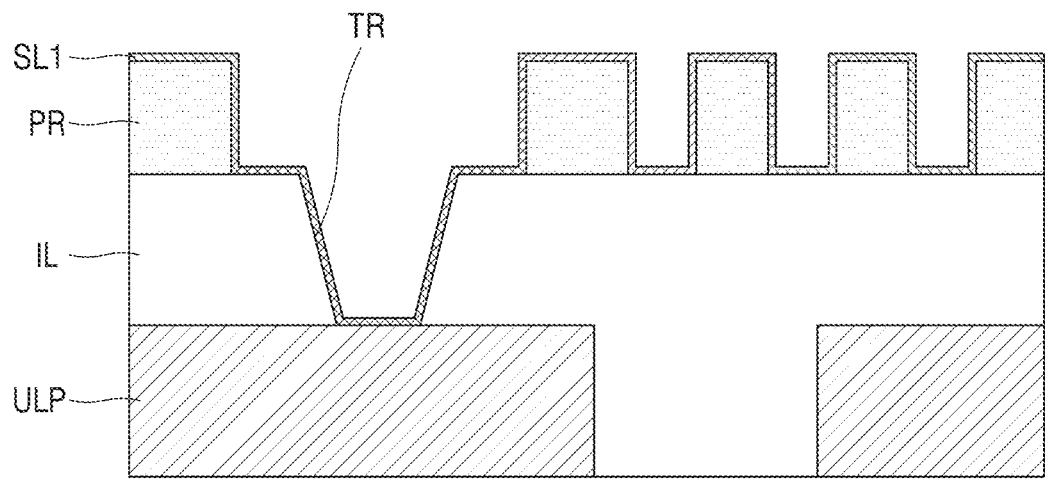

Referring to FIGS. 1 and 4, at least one first seed layer SL1 may be provided in operation P30, but the example embodiments are not limited thereto. The first seed layer SL1 may cover an exposed portion of each of the underlying patterns ULP, the interlayer insulating layer IL, and/or the photoresist pattern PR, etc. According to some example embodiments, the first seed layer SL1 may cover an upper surface of each of the underlying patterns ULP, the interlayer insulating layer IL, and/or the photoresist pattern PR, etc., but the example embodiments are not limited thereto.

According to some example embodiments, the first seed layer SL1 may be provided via a sputtering process, but is not limited thereto. As another example, the first seed layer SL1 may be provided by using other methods, such as physical vapor deposition, atomic layer deposition, etc. According to some example embodiments, the first seed layer SL1 may have a conformal thickness, but is not limited thereto. According to some example embodiments, a thickness of the first seed layer SL1 may be about 100 nm, but the example embodiments are not limited thereto, and other thickness values may be used for the first seed layer, etc.

According to some example embodiments, the first seed layer SL1 may include at least one metal material, etc., but is not limited thereto. According to some example embodiments, the first seed layer SL1 may include at least one of Ti, TiW, TiN, Ta, TaN, Cr, and/or Al, etc., or any combinations thereof.

Figure 5:
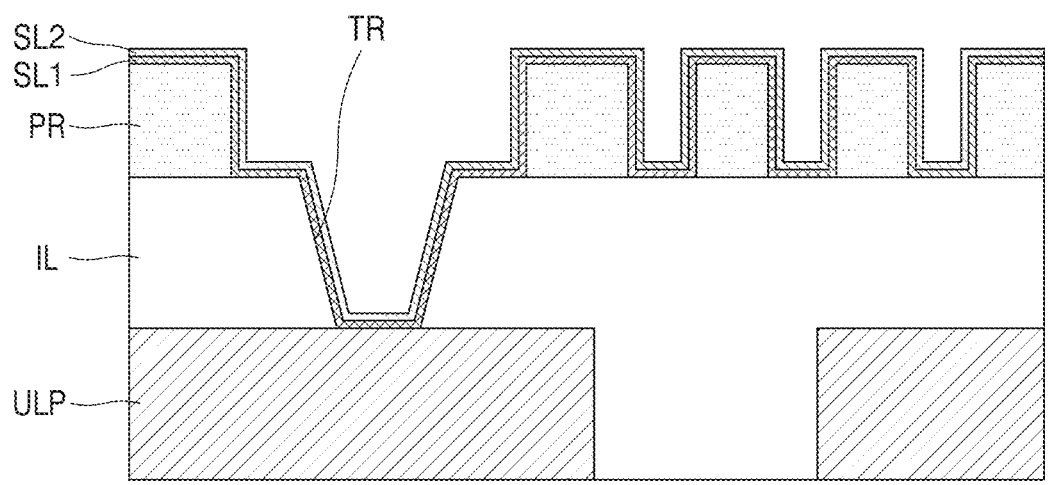

Referring to FIGS. 1 and 5, at least one second seed layer SL2 may be provided in operation P40, but the example embodiments are not limited thereto. The second seed layer SL2 may cover an upper surface of the first seed layer SL1, etc., but is not limited thereto.

According to some example embodiments, the second seed layer SL2 may be provided via a sputtering process, but is not limited thereto. As another example, the second seed layer SL2 may be provided by using other methods, such as physical vapor deposition, atomic layer deposition, etc. The second seed layer SL2 may have a conformal thickness, but is not limited thereto. According to some example embodiments, a thickness of the second seed layer SL2 may be about 150 nm, but is not limited thereto.

The second seed layer SL2 may include at least one material different from the material of the first seed layer SL1, etc., but the example embodiments are not limited thereto. The second seed layer SL2 may include at least one metal, such as Cu, Al, W, Ta, In, Mo, Mn, Co, Sn, Ni, Mg, Re, Be, Ga, Ru, etc., or an alloy thereof, but is not limited thereto.

Figure 6:
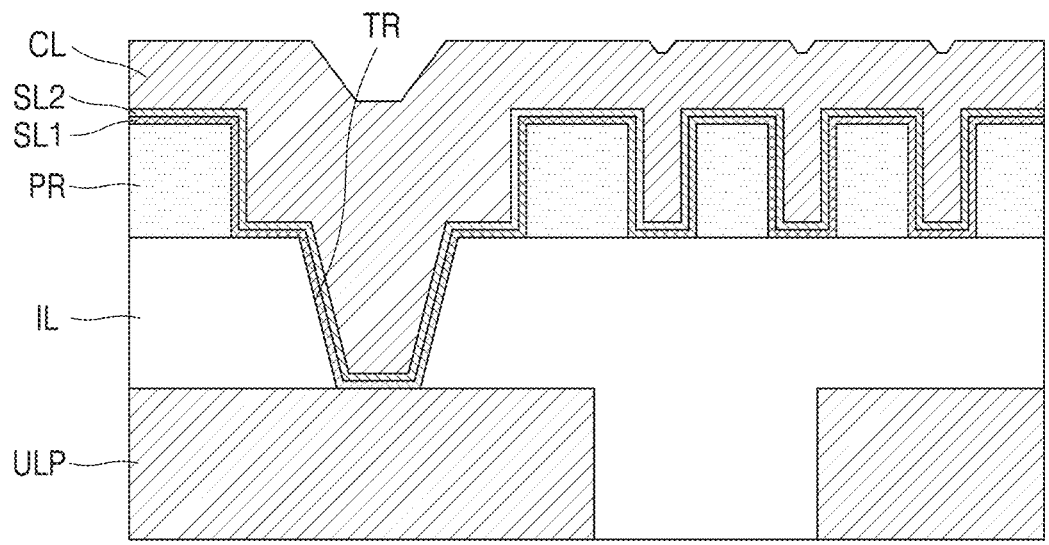

Referring to FIGS. 1 and 6, at least one conductive layer CL may be provided in operation P50, but the example embodiments are not limited thereto.

According to some example embodiments, the conductive layer CL may be formed via epitaxial growth, plating, etc. The conductive layer CL may include at least one material that is the same as the material of the second seed layer SL2. For example, when the second seed layer SL2 includes Cu, the conductive layer CL may also include Cu, etc. According to some example embodiments, the conductive layer CL may be integrated with the second seed layer SL2 to form a continual single layer, but is not limited thereto. When the conductive layer CL is integrated with the second seed layer SL2, there may be no boundary formed between the conductive layer CL and the second seed layer SL2. According to some example embodiments, the conductive layer CL may be provided to sufficiently fill a space between the trench TR and the photoresist pattern PR, but the example embodiments are not limited thereto.

Figure 7:
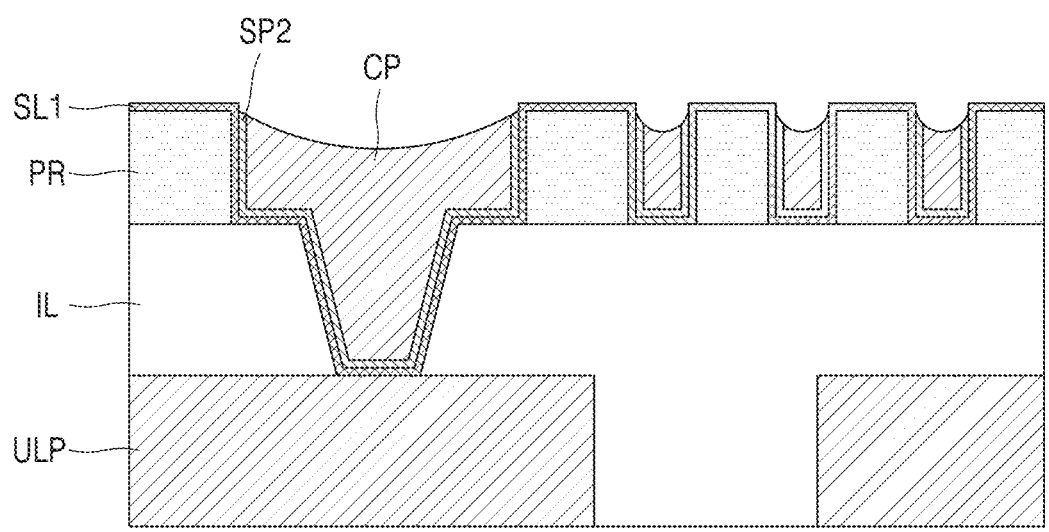

Referring to FIGS. 1, 5, and 7, the conductive layer CL and the second seed layer SL2 may be etched in operation P60, but the example embodiments are not limited thereto.

According to some example embodiments, by etching the conductive layer CL and/or the second seed layer SL2, etc., conductive patterns CP and/or second seed patterns SP2 may be formed separate from the conductive layer CL and/or the second seed layer SL2, etc. According to some example embodiments, the conductive patterns CP and/or the second seed patterns SP2 may be formed via, e.g., wet etching, etc., but is not limited thereto. Accordingly, a plurality of upper surfaces of the conductive patterns CP and/or the plurality of second seed patterns SP2 may include, for example, a wet etching profile that is further recessed from an upper surface of the photoresist pattern PR, etc. The wet etching profile of the upper surfaces of the conductive patterns CP and the second seed patterns SP2 will be described again with reference to FIG. 8.

According to at least one example embodiment, the first seed layer SL may include a different material from the second seed layer SL2 and/or the conductive layer CL, and thus, while the second seed layer SL2 and the conductive layer CL are wet-etched, the first seed layer SL may not be etched, etc., but the example embodiments are not limited thereto.

Figure 8:
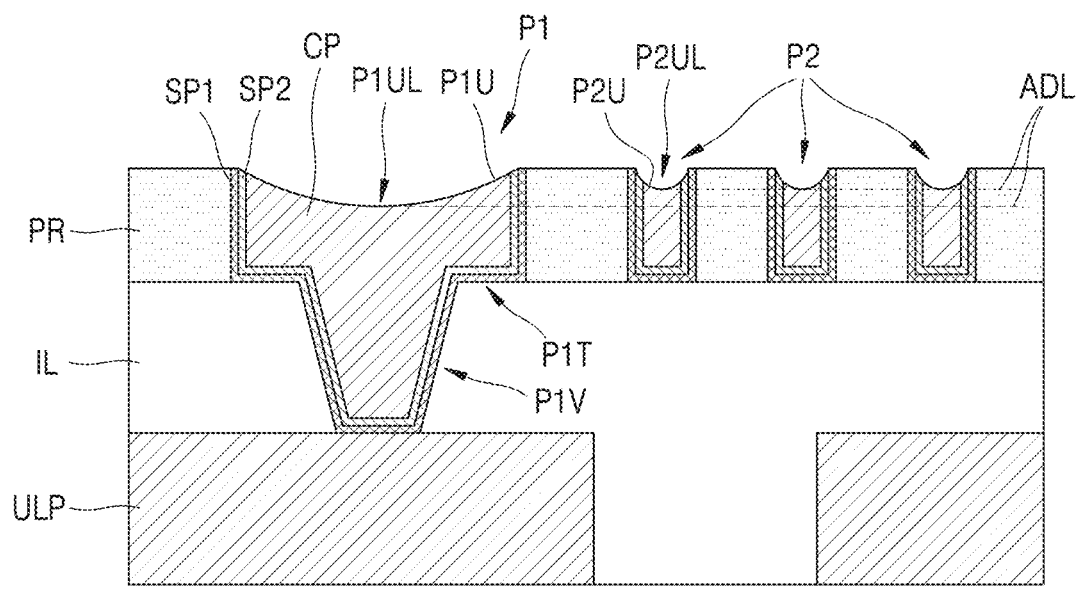

Referring to FIGS. 1, 7, and 8, the at least one first seed layer SL1 may be etched in operation P70.

According to some example embodiments, a plurality of first seed patterns SP1 may be provided by being separated from the first seed layer SL1 via the etching performed on the first seed layer SL1. According to some example embodiments, the first seed patterns SP1 may be formed via, e.g., wet etching, etc., but the example embodiments are not limited thereto. Although not explicitly illustrated, because the first seed patterns SP1 may also be formed via, e.g., wet etching, etc., a top surface of a portion of the first seed patterns SP1 contacting the photoresist pattern PR may be higher than a top surface of a portion of the first seed patterns SP1 contacting the second seed patterns SP2, but the example embodiments are not limited thereto.

According to some example embodiments, the first seed patterns SP1, the second seed patterns SP2, and the conductive patterns CP may comprise a first pattern P1 and/or second patterns P2, etc. According to some example embodiments, the second patterns P2 may have a finer pitch than the first pattern P1, but is not limited thereto.

According to some example embodiments, the first pattern P1 may include at least one trace portion PIT extending in a horizontal direction, and at least one via portion P1V extending in a vertical direction, but is not limited thereto. The first pattern P1 may be connected to at least one of the underlying patterns ULP, etc. Some of the second patterns P2 may further include at least one via portion and may be connected to any one of the underlying patterns ULP, but are not limited thereto.

According to some example embodiments, the upper surface of the second seed patterns SP2 and the upper surface of the conductive layer CL may form a curved etching profile that is concave, recessed, non-uniformly recessed, and/or continually recessed, but the example embodiments are not limited thereto. A lowermost portion P1UL of an upper surface P1U of the first pattern P1 and/or a lowermost portion P2UL of an upper surface P2U of the second patterns P2 may be lower than the upper surface of the photoresist pattern PR, but the example embodiments are not limited thereto.

Here, a relative height concept, such as "high" or "low," may be with respect to a distance from the upper surface of the underlying patterns ULP, etc. For example, when a first element is farther from the underlying patterns ULP than a second element, the first element may be higher than the second element, and the second element may be lower than the first element, etc.

According to some example embodiments, the upper surface P1U of the first pattern P1 may be more recessed than (e.g., lower than) the upper surface P2U of each of the second patterns P2, and/or the upper surface P2U having a relatively less line width than the upper surface P1U, etc. Thus, as indicated by the auxiliary dashed lines ADL of FIG. 8, the lowermost portion P1UL of the upper surface P1U of the first pattern P1 may be lower than the lowermost portion P2UL of the upper surface P2U of each of the second patterns P2, but the example embodiments are not limited thereto.

According to some example embodiments, the first and second patterns P1 and P2 may be formed via, e.g., wet etching rather than metal chemical mechanical polishing (CMP), and thus, the cost of manufacturing of a semiconductor package may be reduced, but the example embodiments are not limited thereto. In particular, in the case of a semiconductor package manufactured by using a panel level package process, it may be difficult to perform CMP. However, the method of forming the first and second patterns P1 and P2 described with reference to the one or more example embodiments associated with FIGS. 1 through 7 may be applied to both the panel level package process and a wafer level package process, thereby improving the efficiency, reliability and/or cost of manufacturing the semiconductor packages and/or semiconductor devices.

Also, the first seed layer SL1 (see FIG. 4) may be provided after the photoresist pattern PR is provided, and thus, damage to the first seed patterns SP1 between the insulating layer IL and/or the conductive patterns PC during the etching of the first seed layer SL1 (see FIG. 4) may be reduced and/or prevented, and the reliability of manufacturing of the semiconductor package and/or semiconductor devices may be enhanced.

According to at least one example embodiment, the underlying patterns ULP may be formed by the same process as the first and second patterns P1 and P2, and the upper surface of the underlying patterns ULP may be substantially flat (e.g., within +/−10% of a flat surface), etc. However, the underlying patterns ULP are not limited thereto. For example, according to at least one example embodiment, the underlying patterns ULP may be formed by using a method that is substantially the same as the method used to manufacture the first and second patterns P1 and P2 described with reference to the one or more example embodiments associated with FIGS. 1 through 7, and in this case, the upper surface of the underlying patterns ULP may also be recessed, etc.

Figure 9:
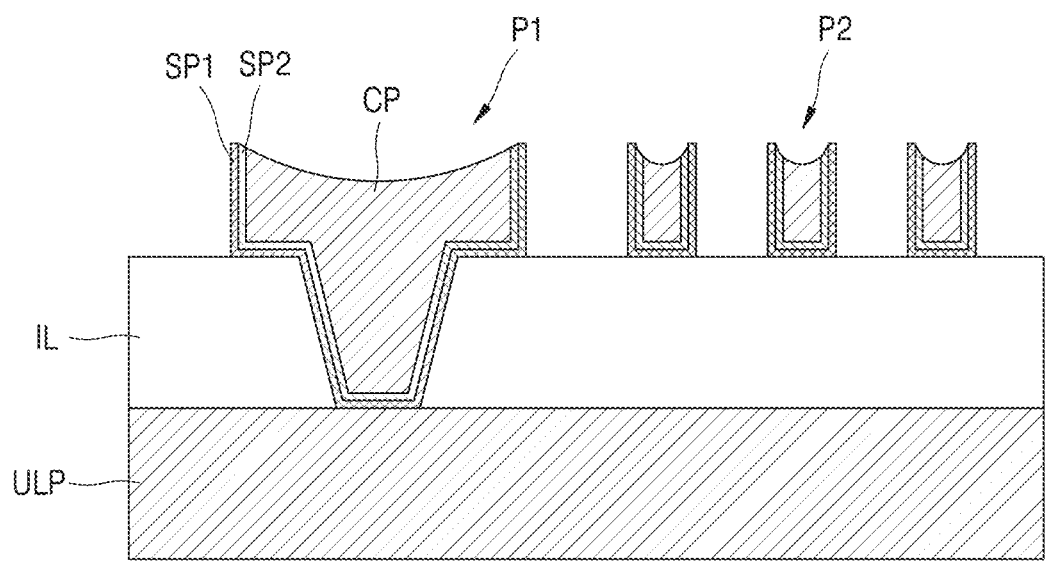

Next, referring to FIGS. 8 and 9, the photoresist pattern PR may be removed. The photoresist pattern PR may be removed by a strip process, but the example embodiments are not limited thereto. The photoresist pattern PR may be removed by using, for example, a water stripping liquid including KOH and MEA, but the example embodiments are not limited thereto.

Above, a series of processes in which a single-layered rewiring structure is formed have been described. Additionally, according to some example embodiments, a method of providing a rewiring structure including a plurality of layers may be performed based on the descriptions given with reference to the one or more example embodiments associated with FIGS. 1 through 9. For example, by repeating the processes of forming the rewiring structure as described with reference to the one or more example embodiments associated with FIGS. 1 through 9 several times, a rewiring structure including a plurality of layers may be provided, etc., but the example embodiments are not limited thereto.

Figure 10:
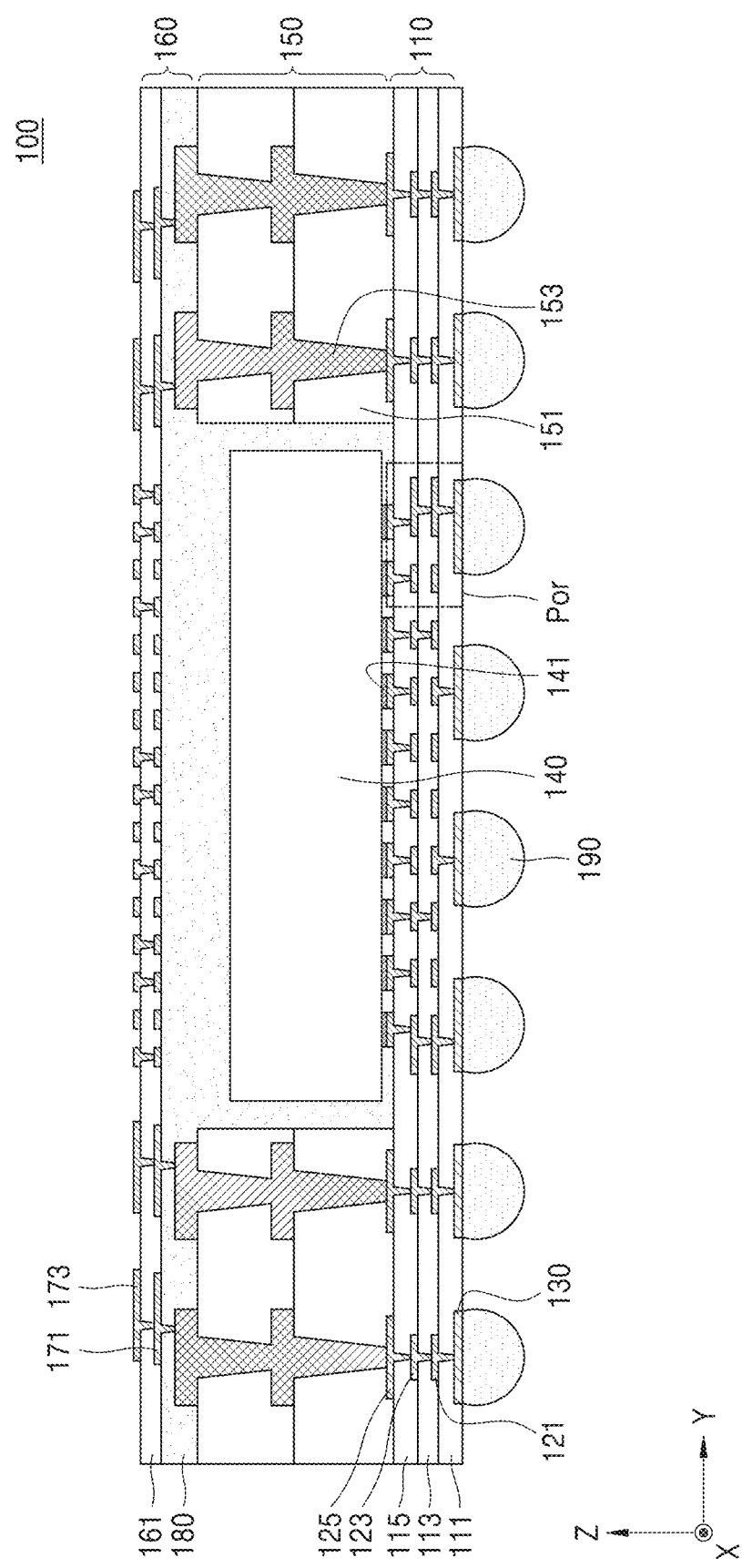
FIG. 10 is a cross-sectional view of a semiconductor package according to some example embodiments.

FIG. 10 is a cross-sectional view of a semiconductor package 100 according to some example embodiments.

Figure 11:
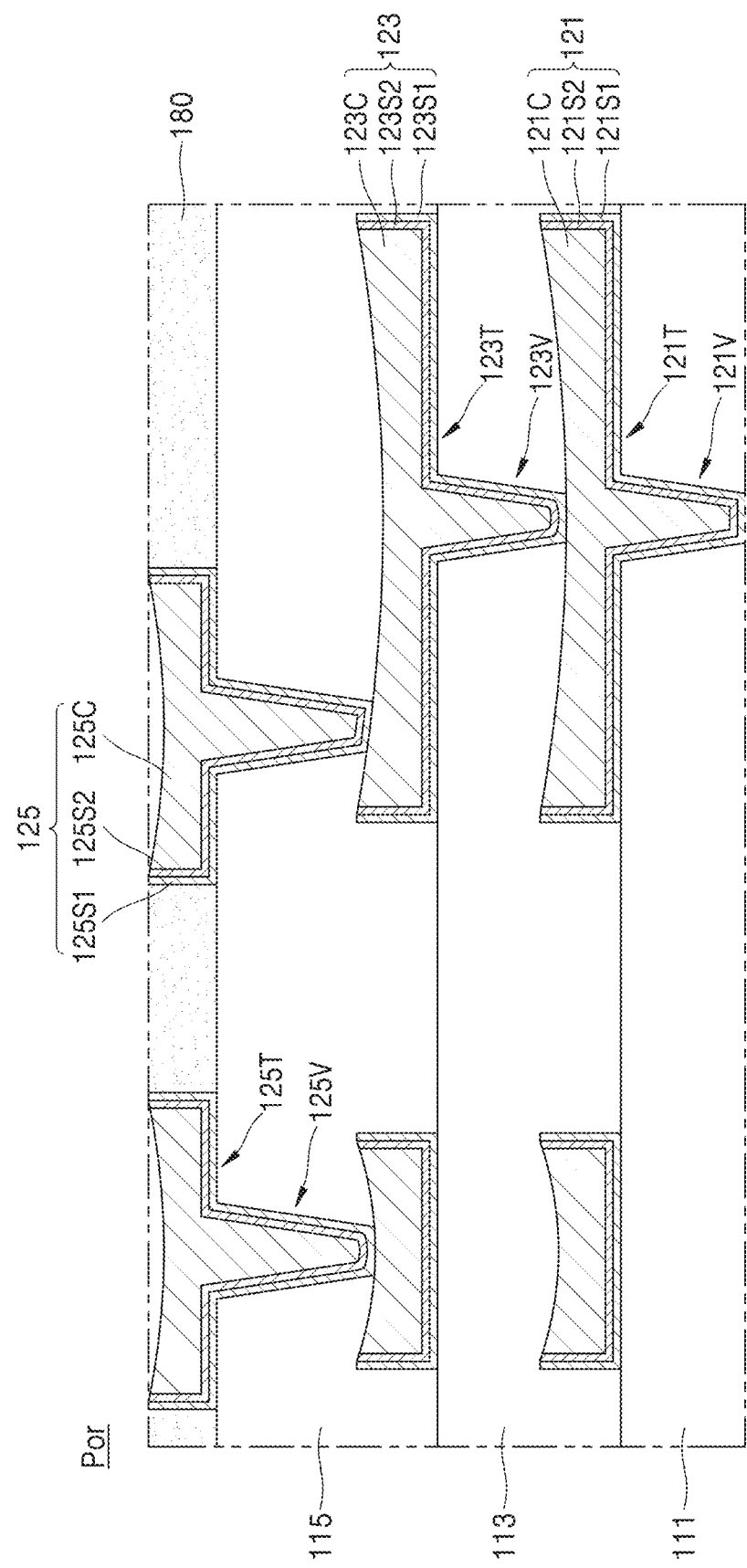
FIG. 11 is an enlarged partial cross-sectional view of a region of FIG. 10 according to at least one example embodiment.

FIG. 11 is an enlarged partial cross-sectional view of a region Por of FIG. 10 according to at least one example embodiment.

Referring to FIGS. 10 and 11, the semiconductor package 100 may include at least one first rewiring structure 110, at least one semiconductor chip 140, at least one intermediate connection structure 150, at least one second rewiring structure 160, and/or at least one molding layer 180, etc., but the example embodiments are not limited thereto.

The first rewiring structure 110 may include a plurality of insulating layers, such as insulating layers 111, 113, and/or 115, etc., a plurality of rewiring patterns, such as rewiring patterns 121, 123, and/or 125, etc., and/or a plurality of pads 130, etc., but is not limited thereto, and for example, may include a greater or lesser number of insulating layers, rewiring patterns, and/or pads, etc. The first rewiring structure 110 may be provided by using the method described with reference to one or more example embodiments associated with FIGS. 1 through 9, but the example embodiments are not limited thereto.

Accordingly, the descriptions with respect to the structures of the first and second patterns P1 and P2 (see e.g., FIG. 8, etc.) may be similarly applied to each of the rewiring patterns 121, the rewiring patterns 123, and the rewiring patterns 125 and thus the descriptions are omitted for the sake of clarity and brevity.

The plurality of insulating layers 111, 113, and 115 may include the same material as the interlayer insulating layer IL as described above, but the example embodiments are not limited thereto.

Here, two directions parallel to an upper surface (for example, a surface facing the semiconductor chip 140, etc.) of the first rewiring structure 110 and perpendicular to each other may be defined as a X direction and a Y direction, and a direction perpendicular to the upper surface of the first rewiring structure 110 may be defined as a Z direction. The definitions of directions are likewise applied to the other drawings unless mentioned additionally.

The plurality of rewiring patterns, e.g., rewiring patterns 121, 123, and/or 125, etc., may include a line- and-space structure including a minute line width and a minute pitch. Here, the minute line width may be equal to or less than about 3 µm, and the minute pitch may be equal to or less than about 6 µm. However, these are only example values and the example embodiments of the inventive concepts are not limited thereto.

The plurality of rewiring patterns 121, 123, and/or 125, etc., may respectively include a plurality of trace portions, e.g., trace portions 121T, 123T, and/or 125T, etc., extending in a horizontal direction (for example, the X direction and/or the Y direction) and via a plurality of portions 121V, 123V, and/or 125V, etc., extending in a vertical direction (for example, the Z direction). The via portions 121V, 123V, and/or 125V, etc., may have a structure tapered downwards (for example, tapered away from the semiconductor chip 140), but are not limited thereto. The trace portions 121T, 123T, and/or 125T, etc., of the plurality of rewiring patterns 121, 123, and/or 125, etc., may be arranged on upper surfaces of the plurality of insulating layers 111, 113, and/or 115, etc., respectively. The via portions 121V, 123V, and 125V of the plurality of rewiring patterns 121, 123, and 125 may penetrate at least one of the plurality of insulating layers 111, 113, and 115 in the vertical direction (for example, the Z direction), but the example embodiments are not limited thereto.

Each of the via portions 121V of the rewiring patterns 121 may contact a corresponding one of the plurality of pads 130, but are not limited thereto. Each of the via portions 123V of the rewiring patterns 123 may contact a corresponding one of the trace portions 121T of the rewiring patterns 121, but are not limited thereto. Each of the via portions 125V of the rewiring patterns 125 may contact a corresponding one of the trace portions 123T of the rewiring patterns 123, but are not limited thereto. In other words, the via portions 121V, 123V, and/or 125V, etc., of the plurality of rewiring patterns 121, 123, and/or 125, etc., may connect and/or contact one or more of the plurality of pads 130 through a respective insulating layer 111, 113, and/or 115, etc., but the example embodiments are not limited thereto.

One or more of the upper surfaces of the trace portions 121T, 123T, and/or 125T, etc., of the rewiring patterns 121, 123, and/or 125, etc., may be recessed to have a curved shape (e.g., recessed shape, concave shape, etc.) similar to the upper surfaces HU and P2U of the first and second patterns P1 and P2 of the at least one example embodiment of FIG. 8, but the example embodiments are not limited thereto. One or more of the upper surfaces of the trace portions 121T, 123T, and/or 125T, etc., of the rewiring patterns 121, 123, and/or 125, etc., may be curved in a concave fashion. The upper surfaces of the trace portions 121T, 123T, and 125T of the rewiring patterns 121, 123, and 125 may have decreasing heights toward a horizontal center, but the example embodiments are not limited thereto.

According to at least one example embodiment, the via portions 123V and 125V contacting the trace portions 121T and 123T, respectively, may have a complementary shape to the trace portions 121T and 123T, respectively, but the example embodiments are not limited thereto. According to some example embodiments, lower surfaces of the via portions 123V and 125V may be curved, but the example embodiments are not limited thereto. The lower surfaces of the via portions 123V and 125V may have a convex shape, but are not limited thereto. According to some example embodiments, the via portions 123V or the via portions 125V between the via portions 123V and the via portions 125V, the via portions 123V and/or the via portions 125V being apart from horizontal centers (that is, centers in the X direction and/or centers in the Y direction) of the trace portions 121T and/or the trace portions 123T contacting the via portions 123V and/or the via portions 125V, may have asymmetrical shapes and/or may have different shapes from each other, etc. According to some example embodiments, the via portions 123V or the via portions 125V between the via portions 123V and the via portions 125V, the via portions 123V and/or the via portions 125V overlapping, in the Z direction, the horizontal centers of the trace portions 121T and/or the trace portions 123T contacting the via portions 123V and/or the via portions 125V, may have symmetrical shapes and/or similar shapes to each other, etc., but the example embodiments are not limited thereto.

The insulating layer 111 may cover side surfaces and/or upper surfaces of the plurality of pads 130 and side surfaces of the via portions 121V of the rewiring patterns 121, etc. The insulating layer 113 may cover side surfaces and/or upper surfaces of the trace portions 121T of the rewiring patterns 121 and side surfaces of the via portions 123V of the rewiring patterns 123, etc. The insulating layer 115 may cover side surfaces and/or upper surfaces of the trace portions 123T of the rewiring patterns 123 and side surfaces of the via portions 125V of the rewiring patterns 125, etc.

Accordingly, portions of the insulating layer 113 contacting the upper surfaces of the trace portions 121T of the rewiring patterns 121, may have a complementary shape to the upper surfaces of the trace portions 121T of the rewiring patterns 121, but the example embodiments are not limited thereto. The portions of the insulating layer 113 contacting the upper surfaces of the trace portions 121T of the rewiring patterns 121, may have a curved shape that is convex in such a way that the curved shape protrudes more in the Z direction toward a center of a line width of the trace portions 121T of the rewiring patterns 121, but the example embodiments are not limited thereto.

Similarly, portions of the insulating layer 115, and/or the portions contacting the upper surfaces of the trace portions 123T of the rewiring patterns 123, may have a complementary shape to the upper surfaces of the trace portions 123T of the rewiring patterns 123, but are not limited thereto. The portions of the insulating layer 115, and/or the portions contacting the upper surfaces of the trace portions 123T of the rewiring patterns 123 may have a curved shape that is convex in such a way that the curved shape protrudes more in the Z direction toward a center of a line width of the trace portions 123T of the rewiring patterns 123, but the example embodiments are not limited thereto.

Each of the rewiring patterns 121 may include at least one first seed pattern 121S1, at least one second seed pattern 121S2, and/or at least one conductive pattern 121C, etc., but are not limited thereto. Each of the rewiring patterns 123 may include at least one first seed pattern 123S1, at least one second seed pattern 123S2, and/or at least one conductive pattern 123C, etc., but are not limited thereto. Each of the rewiring patterns 125 may include at least one first seed pattern 125S1, at least one second seed pattern 125S2, and/or at least one conductive pattern 125C, etc., but are not limited thereto.

The first seed patterns, e.g., first seed patterns 121S1, 123S1, and/or 125S1, etc., may have conformal shapes. The first seed patterns 121S1, 123S1, and/or 125S1, etc., may define the side surfaces and/or lower surfaces of the trace portions 121T, 123T, and/or 125T, etc., of the rewiring patterns 121, 123, and/or 125, etc., respectively. The first seed patterns 121S1, 123S1, and/or 125S1, etc., may define the side surfaces and/or lower surfaces of the via portions 121V, 123V, and/or 125V, etc., of the rewiring patterns 121, 123, and/or 125, etc., respectively. The second seed patterns 121S2, 123S2, and/or 125S2, etc., may have conformal shapes and may at least partially fill spaces defined by the first seed patterns 121S1, 123S1, and/or 125S1, etc., respectively, but the example embodiments are not limited thereto. The conductive patterns 121C, 123C, and/or 125C, etc., may fill the spaces defined by the first seed patterns 121S1, 123S1, and/or 125S1, etc., respectively, but the example embodiments are not limited thereto.

Lower surfaces and/or side surfaces of the conductive patterns 121C, 123C, and/or 125C, etc., may be covered by the second seed patterns 121S2, 123S2, and/or 125S2, etc., respectively, but the example embodiments are not limited thereto. Side surfaces and/or lower surfaces of the second seed patterns 121S2, 123S2, and/or 125S2 may be covered by the first seed patterns 121S1, 123S1, and/or 125S1, respectively, but the example embodiments are not limited thereto.

The first seed patterns 121S1, 123S1, and/or 125S1, etc., may include the same material as the first seed patterns SP1 of the at least one example embodiment associated with FIG. 9, the second seed patterns 121S2, 123S2, and/or 125S2, etc., may include the same material as the second seed patterns SP2 of the at least one example embodiment associated with FIG. 9, and/or the conductive patterns 121C, 123C, and/or 125C, etc., may include the same material as the conductive patterns CP of the at least one example embodiment associated with FIG. 9, but the example embodiments are not limited thereto. When the conductive patterns 121C, 123C, and/or 125C, etc., include Cu, the first seed patterns 121S1, 123S1, and/or 125S1, etc., may function as diffusion barrier layers.

The plurality of pads 130 may be arranged on a lower surface of the first rewiring structure 110, but is not limited thereto. An external connection terminal 190 may be arranged on the plurality of pads 130, etc. The semiconductor package 100 may be mounted on a module substrate and/or a system board of an electronic product through electrical connection via the external connection terminal 190, but is not limited thereto. The plurality of pads 130 may include an under bump metallurgy (UBM) contacting the external connection terminal 190, but the example embodiments are not limited thereto.

According to some example embodiments, the plurality of pads 130 may have a uniform thickness, or a substantially uniform thickness (e.g., +/−10% thickness, etc.), or in other words a uniform or substantially uniform length in the Z direction, but the example embodiments are not limited thereto. Bottom surfaces of the plurality of pads 130, on which the external connection terminal 190 is arranged, may be flat or substantially flat (e.g., +/−10% flatness, etc.), but the example embodiments are not limited thereto. For example, the plurality of pads 130 may include at least one metal, such as Cu, Al, W, Ti, Ta, In, Mo, Mn, Co, Sn, Ni, Mg, Re, Be, Ga, Ru, etc., or an alloy thereof, but are not limited thereto.

FIG. 11 illustrates that the first rewiring structure 110 includes the insulating layers 111, 113, and 115 as three layers (that is, formed on three different vertical levels) and the rewiring patterns 121, 123, and 125 on three layers. However, the first rewiring structure 110 is not limited thereto. The number of insulating layers and the number of layers on which the rewiring patterns are formed may be variously modified as desired.

The semiconductor chip 140 may be coupled to and/or formed on the first rewiring structure 110, etc. For example, the semiconductor chip 140 may be mounted on the first rewiring structure 110 in a flip chip manner, etc.

The semiconductor chip 140 may include a memory chip and/or a logic chip, etc. The memory chip may include a volatile memory chip, such as dynamic random-access memory (DRAM) static random-access memory (SRAM), etc., and/or a non-volatile memory chip, such as phase-change random-access memory (PRAM), magneto-resistive random-access memory (MRAM), ferroelectric random-access memory (FeRAM), and/or resistive random-access memory (RRAM), etc. In some example embodiments, the memory chip may include a high bandwidth memory (HMB) DRAM semiconductor chip, etc. Also, the logic chip may include, for example, a micro-processor, a computer processing unit (CPU), a graphics processing unit (GPU), an analog device, and/or a digital signal processor, a field programmable gate array (FPGA), a programmable logic unit, an application-specific integrated circuit (ASIC), a System-on-Chip (SoC), etc.

The semiconductor chip 140 may include a semiconductor substrate and/or chip pads 141 arranged on a surface of the semiconductor substrate, etc., but is not limited thereto. The chip pads 141 may be connected to one or more of the rewiring patterns 125, etc. The chip pads 141 may contact the rewiring patterns 125, but are not limited thereto. For example, solder balls and/or solder bumps may be provided between the chip pads 141 and the rewiring patterns 125, etc.

The semiconductor substrate may include, for example, silicon (Si), etc. Additionally, the semiconductor substrate may include a semiconductor element, such as germanium (Ge), and/or a compound semiconductor, such as silicon carbide (SiC), gallium arsenide (GaAs), indium arsenide (InAs), indium phosphide (InP), etc. The semiconductor substrate may have an active surface and a non-active surface (e.g., an inactive surface) opposite to the active surface, but the example embodiments are not limited thereto. According to some example embodiments, the active surface of the semiconductor substrate may be directed toward (and/or facing) the first rewiring structure 110, but is not limited thereto. The semiconductor chip 140 may include a semiconductor device including various types of individual devices formed on the active surface of the semiconductor substrate, but is not limited thereto.

Through the rewiring patterns 121, 123, and/or 125, etc., of the first rewiring structure 110, the plurality of pads 130, and/or the external connection terminal 190, etc., the semiconductor chip 140 may receive at least one of a control signal, a power signal, and/or a ground signal, etc., desired for performing one or more operations of the semiconductor chip 140 from an external source, receive at least one data signal to be stored in the semiconductor chip 140 from the external source, and/or provide data stored in the semiconductor chip 140 to the external source, etc., but the example embodiments are not limited thereto.

The intermediate connection structure 150 may include insulating layers 151 and/or through-silicon vias (TSVs) 153 penetrating the insulating layers 151, etc. The insulating layers 151 may horizontally surround and/or are in a lateral position to the semiconductor chip 140, but the example embodiments are not limited thereto. The TSVs 153 and the rewiring patterns 125 may be electrically connected to each other, but are not limited thereto. FIG. 10 illustrates the insulating layers 151 and the TSVs 153 each as two layers. However, the example embodiments are not limited thereto, and for example, only a single insulating layer and a single TSV may be provided, or three or more insulating layers and TSVs may be provided, etc. According to some example embodiments, the semiconductor package 100 may be manufactured via a panel level process, but is not limited thereto. The panel level process refers to a process in which, after a separate semiconductor chip is inserted into an opening formed in a square-shaped printed circuit board (PCB), the semiconductor chip is molded and a rewiring layer and a solder ball are provided to the semiconductor chip. The intermediate connection structure 150 may be a circuit pattern formed and/or pre-formed on a panel on which the semiconductor chip 140 is to be mounted.

The intermediate connection structure 150 may be horizontally apart from a side surface of the semiconductor chip 140. According to some example embodiments, the semiconductor chip 140 may be arranged on a central portion of the first rewiring structure 110, but the example embodiments are not limited thereto. The intermediate connection structure 150 may be arranged on an edge portion of the first rewiring structure 110 such that the intermediate connection structure 150 horizontally surrounds the semiconductor chip 140 and/or are in a lateral location to the semiconductor chip 140, but the example embodiments are not limited thereto.

The TSVs 153 may be arranged on the rewiring patterns 125 functioning as pads, but are not limited thereto. The TSVs 153 may be electrically connected to the semiconductor chip 140 through at least one of the rewiring patterns 121, 123, and/or 125, etc. Each of the TSVs 153 may be electrically connected to the external connection terminal 190 through corresponding ones of the rewiring patterns 121, 123, and/or 125, etc., and corresponding ones of the plurality of pads 130 corresponding thereto. The TSVs 153 may include, for example, Cu, etc., but are not limited thereto.

The molding layer 180 may be arranged on an upper surface of the first rewiring structure 110. The molding layer 180 may cover at least a portion of the semiconductor chip 140 and/or at least a portion of the intermediate connection structure 150 (for example, a portion of a side surface and/or a portion of an upper surface, etc.). The molding layer 180 may include, for example, an epoxy molding compound (EMC), etc. However, the molding layer 180 is not limited to an EMC and may include various materials, for example, an epoxy-based material, a thermosetting material, a thermoplastic material, an ultraviolet (UV) processing material, etc.

The second rewiring structure 160 may be provided on the molding layer 180. The second rewiring structure 160 may be substantially the same as the first rewiring structure 110, but the example embodiments are not limited thereto. However, the second rewiring structure 160 may include one insulating layer 161 and/or rewiring patterns 171 and 173 as two separate layers, etc. The number of insulating layers 161 and the number of layers on which the rewiring patterns 171 and 173 are arranged, in the second rewiring structure 160, may be variously modified according to design considerations. The structure and the configuration of the rewiring patterns 123, 123, and/or 125, etc., may be similarly applied to the rewiring patterns 171 and/or 173, etc., and thus, the same descriptions are omitted.

Figure 12:
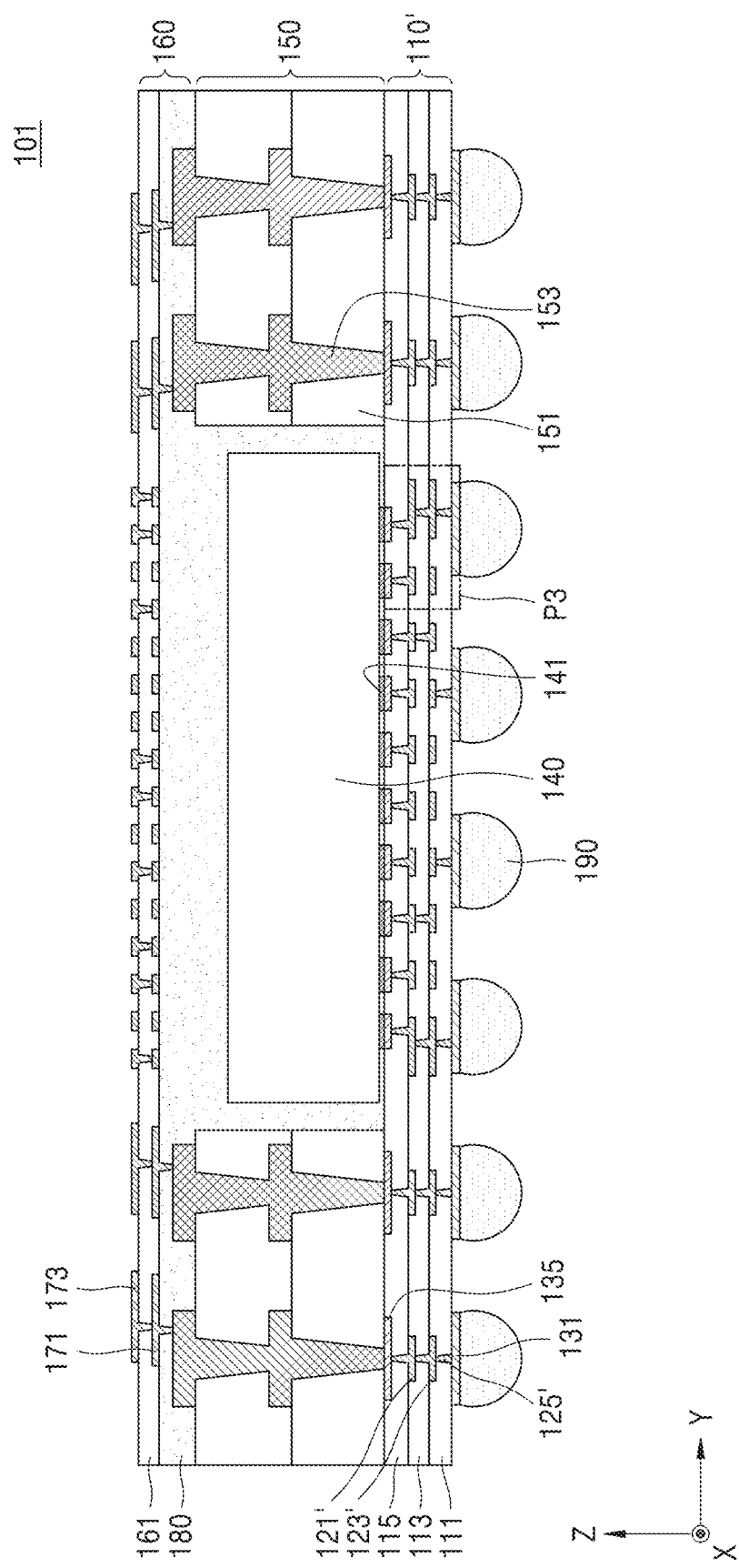
FIG. 12 is a cross-sectional view of a semiconductor package according to some example embodiments.

FIG. 12 is a cross-sectional view of a semiconductor package 101 according to some example embodiments.

Figure 13:
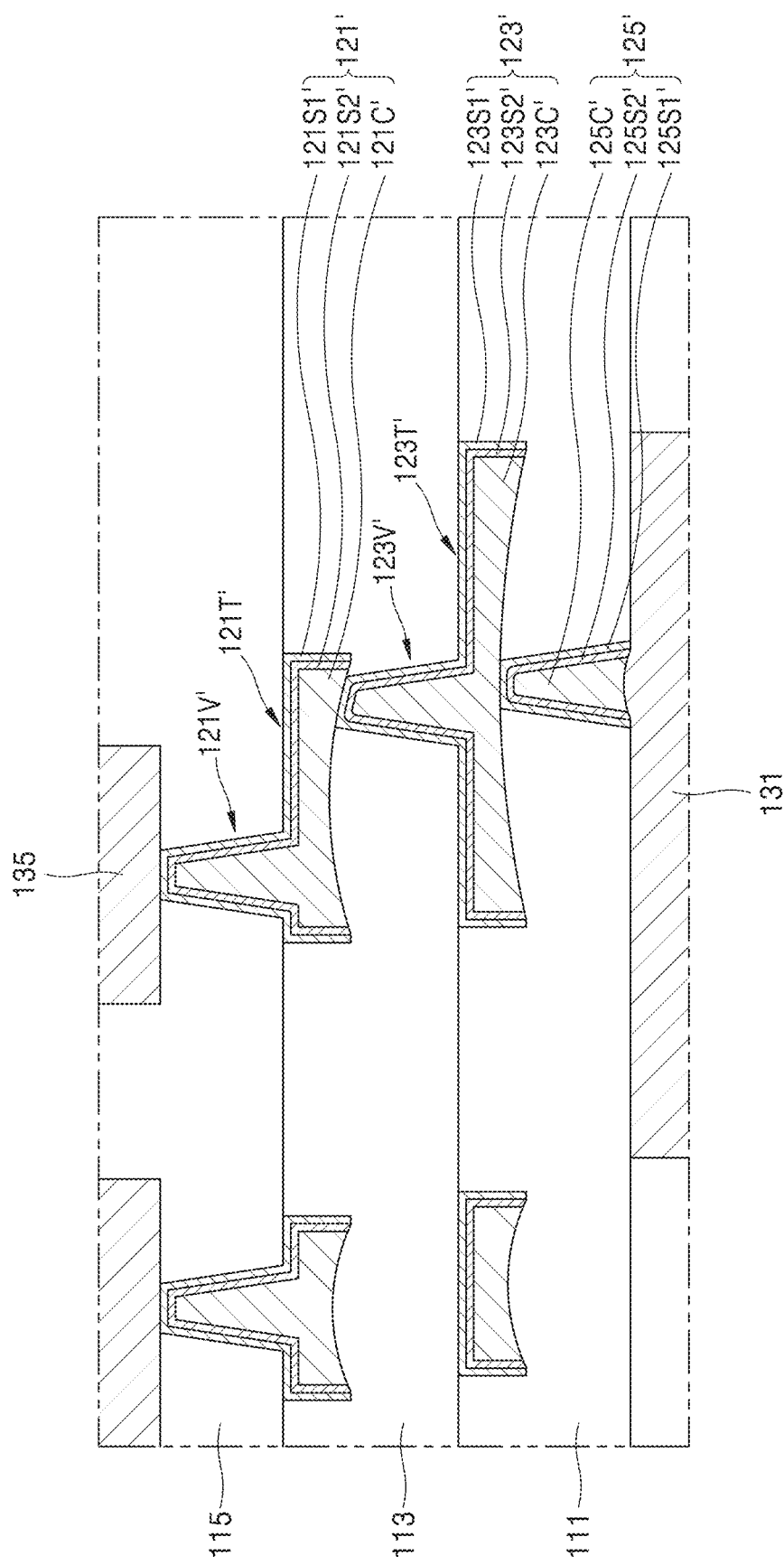
FIG. 13 is an enlarged partial cross-sectional view of a region of FIG. 12 according to at least one example embodiment.

FIG. 13 is an enlarged partial cross-sectional view of a region Por of FIG. 12 according to at least one example embodiment.

For the sake of clarity and brevity, the same aspects as described with reference to FIGS. 10 and 11 are not repeatedly described, and different aspects are mainly described.

Referring to FIGS. 12 and 13, according to some example embodiments, the semiconductor package 101 may include a first rewiring structure 110', the semiconductor chip 140, the intermediate connection structure 150, the second rewiring structure 160, and/or the molding layer 180, etc., but is not limited thereto.

The first rewiring structure 110' may include the plurality of insulating layers 111, 113, and 115, lower pads 131, a plurality of rewiring patterns 121', 123', and 125', and/or upper pads 135, etc., but is not limited thereto.

The plurality of rewiring patterns 121' and 123' may include trace portions 121T' and 123T' extending in a horizontal direction (for example, the X direction and the Y direction), and via portions 121V' and 123V' extending in a vertical direction (for example, the Z direction). The rewiring patterns 125' may include only via portions, but is not limited thereto. The via portions 121V' and 123V' and the rewiring patterns 125' each may have a structure tapered upwards (for example, toward the semiconductor chip 140), but the example embodiments are not limited thereto, and for example, the via portions and/or the rewiring portions may not be tapered, etc. The trace portions 121T' and 123T' of the plurality of rewiring patterns 121' and 123' may be arranged on lower surfaces of the plurality of insulating layers 113 and 115, respectively. The via portions 121V' and 123V' of the plurality of rewiring patterns 121' and 123' and the rewiring patterns 125V' may penetrate at least one of the plurality of insulating layers 111, 113, and 115 in the vertical direction (for example, the Z direction), etc.

Each of the via portions 121V' of the rewiring patterns 121' may contact a corresponding one of the upper pads 135. Each of the via portions 123V' of the rewiring patterns 123' may contact a corresponding one of the trace portions 121T' of the rewiring patterns 121'. Each of the rewiring patterns 125' may contact a corresponding one of the trace portions 123T' of the rewiring patterns 123'.

Lower surfaces of the trace portions 121T' and 123T' of the rewiring patterns 121' and 123' and/or lower surfaces of the rewiring patterns 125' may be recessed to have a curved shape similar to the upper surfaces HU and P2U of the first and second patterns P1 and P2 of FIG. 8, but the example embodiments are not limited thereto, and for example, may different shapes, etc. The lower surfaces of the trace portions 121T' and 123T' of the rewiring patterns 121' and 123' and the lower surfaces of the rewiring patterns 125' may be curved in a concave fashion, but is not limited thereto. Additionally, the lower surfaces of the trace portions 121T' and 123T' of the rewiring patterns 121' and 123' and the lower surfaces of the rewiring patterns 125' may have decreasing heights toward a horizontal center, but are not limited thereto.

The via portions 123V' and/or the re-wiring patterns 125' contacting the trace portions 121T' and 123T', respectively, may have a complementary shape to the trace portions 121T' and 123T', respectively, but are not limited thereto. According to some example embodiments, upper surfaces of the via portions 123V' and/or the rewiring patterns 125V' may be curved, but are not limited thereto. The upper surfaces of the via portions 123V' and the rewiring patterns 125' may have a convex shape, etc. According to some example embodiments, the via portions 123V' and/or the rewiring patterns 125' between the via portions 123V' and the rewiring patterns 125', the via portions 123V' and/or the rewiring patterns 125' being apart from horizontal centers (that is, centers in the X direction and/or centers in the Y direction) of the trace portions 121T' and/or the trace portions 123T' contacting the via portions 123V' or the rewiring patterns 125', may have asymmetrical shapes, but the example embodiments are not limited thereto. According to some example embodiments, the via portions 123V' and/or the rewiring patterns 125' between the via portions 123V' and the rewiring patterns 125', the via portions 123V' and/or the rewiring patterns 125' overlapping, in the Z direction, the horizontal centers of the trace portions 121T' and/or the trace portions 123T' contacting the via portions 123V' and/or the rewiring patterns 125', may have symmetrical shapes, but are not limited thereto.

The insulating layer 111 may cover upper surfaces of the lower pads 131, side surfaces of the rewiring patterns 125', and/or upper surfaces and side surfaces of the trace portions 123T' of the rewiring patterns 123', etc. The insulating layer 113 may cover the upper surfaces of the trace portions 123T' of the rewiring patterns 123', side surfaces of the via portions 123V' of the rewiring patterns 123', and/or upper surfaces and side surfaces of the trace portions 121T' of the rewiring patterns 121', etc. The insulating layer 115 may cover the upper surfaces of the trace portions 121T' of the rewiring patterns 121', side surfaces of the via portions 121V' of the rewiring patterns 121', and/or upper surfaces and side surfaces of the upper pads 135, etc.

Each of the rewiring patterns 121' may include at least one first seed pattern 121S1', at least one second seed pattern 121S2', and/or at least one conductive pattern 121C', etc., but the example embodiments are not limited thereto. Each of the rewiring patterns 123' may include at least one first seed pattern 123S1', at least one second seed pattern 123S2', and at least one conductive pattern 123C', etc., but the example embodiments are not limited thereto. Each of the rewiring patterns 125' may include at least one first seed pattern 125S1', at least one second seed pattern 125S2', and/or at least one conductive pattern 125C', etc, but the example embodiments are not limited thereto.

The first seed patterns 121S1', 123S1', and/or 125S1' may have conformal shapes to each other (e.g., may have similar shapes to each other and/or a same shape as each other) and/or the molding layer 180 and the insulating layer 115, but are not limited thereto. The first seed patterns 121S1' and/or 123S1' may define the side surfaces and/or the upper surfaces of the trace portions 121T' and 123T' of the rewiring patterns 121' and 123', respectively, and the first seed pattern 125S' may define the side surfaces and/or the upper surfaces of the rewiring patterns 125', etc., but are not limited thereto. The first seed patterns 121S1' and 123S1' may define the side surfaces and/or the upper surfaces of the via portions 121V' and 123V' of the rewiring patterns 121' and 123', respectively, but are not limited thereto. The second seed patterns 121S2', 123S2', and 125S2' may have conformal shapes to each other (e.g., may have similar shapes to each other and/or same shape as each other) and may at least partially fill spaces defined by the first seed patterns 121S1', 123S1', and 125S1', respectively, but the example embodiments are not limited thereto. The conductive patterns 121C', 123C', and 125C' may fill the spaces defined by the first seed patterns 121S1', 123S1', and 125S1', respectively, but are not limited thereto. A conformal shape of a specific element indicates that the specific element having a substantially constant thickness is formed on an underlying structure having a complex three-dimensional structure, and the angles of the three-dimensional structure are transferred to the specific element.

Side surfaces and upper surfaces of the conductive patterns 121C', 123C', and 125C' may be covered by the second seed patterns 121S2', 123S2', and 125S2', respectively, etc. Side surfaces and upper surfaces of the second seed patterns 121S2', 123S2', and 125S2' may be covered by the first seed patterns 121S1', 123S1', and 125S1', respectively, etc.

The first seed patterns 121S1', 123S1', and 125S1' may include the same material as the first seed patterns SP1 of the at least one example embodiment associated with FIG. 9, the second seed patterns 121S2', 123S2', and 125S2' may include the same material as the second seed patterns SP2 of the at least one example embodiment associated with FIG. 9, and the conductive patterns 121C', 123C', and 125C' may include the same material as the conductive patterns CP of the at least one example embodiment associated with FIG. 9, but the example embodiments are not limited thereto. According to some example embodiments, when the conductive patterns 121C', 123C', and 125C' include Cu, the first seed patterns 121S1', 123S1', and 125S1' may function as diffusion barrier layers.

According to some example embodiments, the upper pads 135 may have uniform thicknesses, but are not limited thereto. According to some example embodiments, the lower pads 131 may have uniform thicknesses. However, the lower pads 131 are not limited thereto. Portions of the lower pads 131, the portions contacting the rewiring patterns 125', may have complementary shapes to the upper surfaces of the rewiring patterns 125', etc. The lower pads 131 and the upper pads 135 may include the materials discussed with respect to the plurality of pads 130 (see, e.g., FIG. 10), but are not limited thereto. The external connection terminal 190 may be arranged on the lower pads 131, etc. The upper pads 135 may contact the chip pads 141 and/or the TSVs 153, etc.

Figure 14:
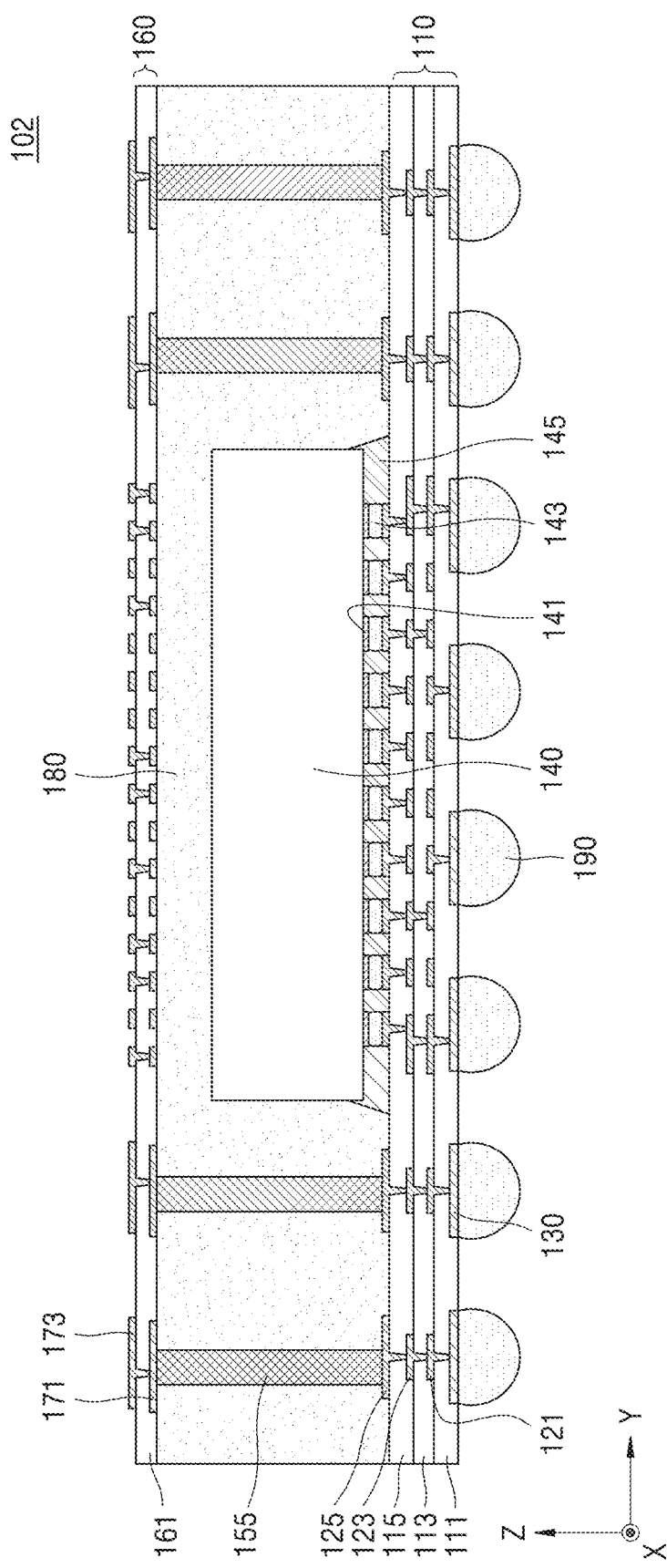
FIG. 14 is a cross-sectional view of a semiconductor package according to some other example embodiments.

FIG. 14 is a cross-sectional view of a semiconductor package 102 according to some other example embodiments.

For the sake of clarity and brevity, the same aspects as described with reference to FIGS. 10 and 11 are not repeatedly described, and different aspects are mainly described.

Referring to FIG. 14, the semiconductor package 102 may include the first rewiring structure 110, the semiconductor chip 140, conductive posts 155, the second rewiring structure 160, and/or the molding layer 180, etc., but are not limited thereto, and for example, may include a greater or lesser number of constituent components, etc.

According to some example embodiments, the semiconductor package 102 may be provided by a wafer level process, but is not limited thereto. In the wafer level process, after the semiconductor chips 140, in which integrated circuits are formed such that a carrier wafer and active surfaces of the semiconductor chips 140 face each other, may be mounted on the carrier wafer, etc. A molding process may be performed on the semiconductor chips 140 mounted on the carrier wafer, and then, the carrier wafer may be removed. Next, the first rewiring structure 110 and the external connection terminal 190 may be provided on and/or formed on the molded semiconductor chips 140, and then, the semiconductor chips 140 may be separated to provide the semiconductor package 102. According to some example embodiments, before the separation of the semiconductor chips 140, the conductive posts 155 penetrating the molding layer 180 may further be formed, and the second rewiring structure 160 may further be formed by a rewiring process with respect to a back surface, etc.

According to some example embodiments, a connection terminal 143, such as at least one solder ball and/or at least one bump, etc., may be arranged between the first rewiring structure 110 and the semiconductor chip 140. The connection terminal 143 may be connected to each of the rewiring patterns 125 and/or the chip pads 141, etc.

An under-fill layer 145 covering the connection terminal 143, chip bumps, and/or the rewiring patterns 125, etc., may be further provided between the first rewiring structure 110 and the semiconductor chip 140, but the example embodiments are not limited thereto. The under-fill layer 145 may include, for example, epoxy resins, etc., and may be provided by a capillary under-fill method, but the example embodiments are not limited thereto. According to some example embodiments, the under-fill layer 145 may include a non-conductive film (NCF), etc., but is not limited thereto.

The conductive posts 155 may be horizontally apart from a side surface of the semiconductor chip 140, but are not limited thereto. According to some example embodiments, the semiconductor chip 140 may be arranged on a central portion of the first rewiring structure 110, and the conductive posts 155 may be arranged on an edge portion of the first rewiring structure 110 that the conductive posts 155 horizontally surround, but the example embodiments are not limited thereto. The conductive posts 155 may have a shape of a post or a shape of a pillar penetrating the molding layer 180, and may be vertically (for example, in the Z direction) extending, but the example embodiments are not limited thereto. The conductive posts 155 may be arranged on the rewiring patterns 125. The conductive posts 155 may be electrically connected to the semiconductor chip 140 through at least one of the rewiring patterns 121, 123, and 125, but are not limited thereto. Each of the conductive posts 155 may be electrically connected to the external connection terminal 190 through corresponding ones of the rewiring patterns 110, the rewiring patterns 120, the rewiring patterns 130, and/or a corresponding one of the plurality of pads 130, etc. The conductive posts 155 may include, for example, Cu, etc., but is not limited thereto. The conductive posts 155 may provide electrical connection between the first rewiring structure 110 and the second rewiring structure 160, etc.

Figure 15:
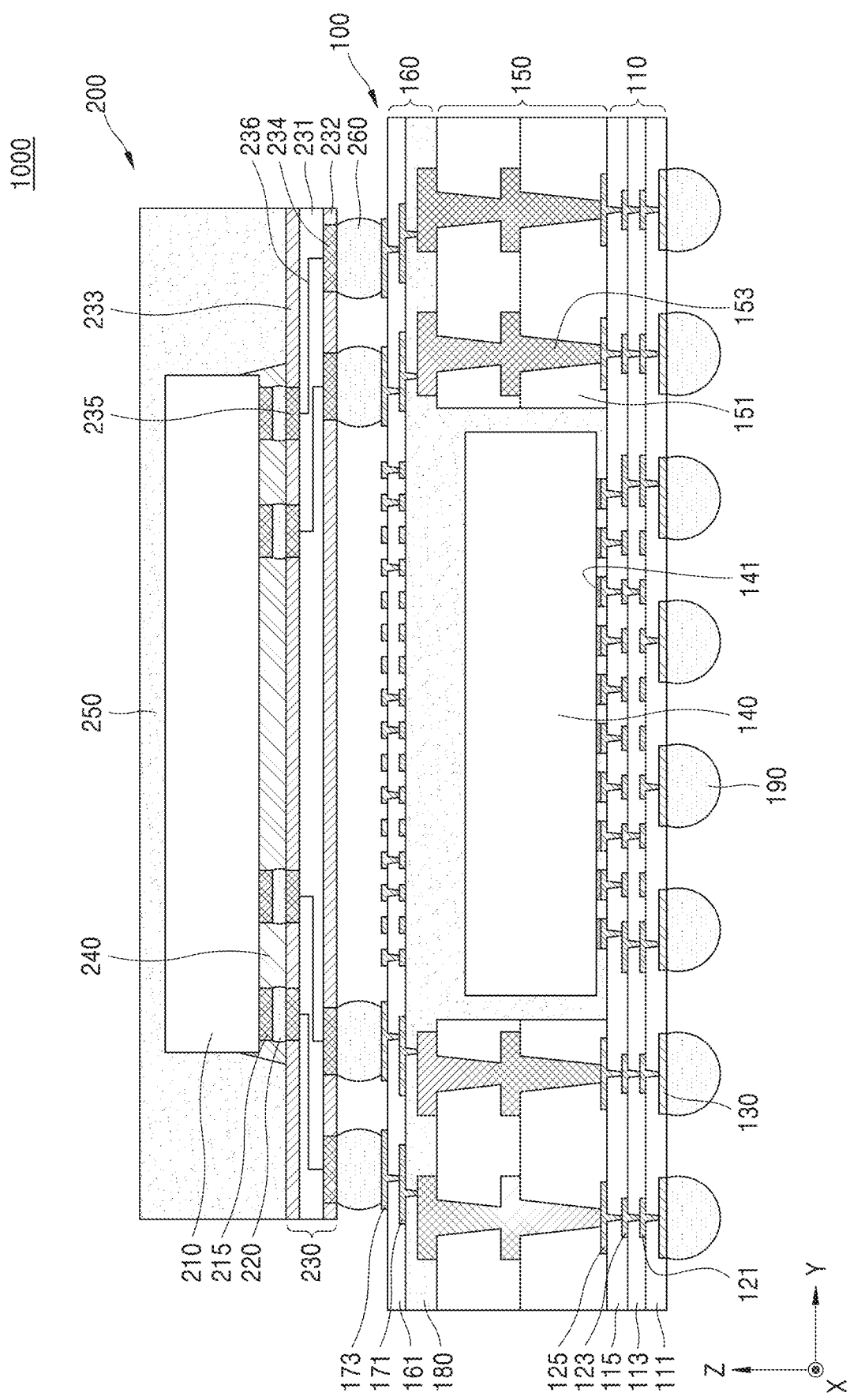
FIG. 15 is a cross-sectional view of a semiconductor package according to some other example embodiments.

FIG. 15 is a cross-sectional view of a semiconductor package 1000 according to some additional example embodiments.

Referring to FIG. 15, the semiconductor package 1000 may include the semiconductor package 100 and/or a semiconductor package 200, but is not limited thereto, and for example, may include a greater or lesser number of semiconductor packages, etc. The semiconductor package 1000 may be a package-on-package type semiconductor package, in which the semiconductor package 200 is stacked on the semiconductor package 100, but the example embodiments are not limited thereto. Hereinafter, the semiconductor package 100 may also be referred to as a lower semiconductor package, and the semiconductor package 200 may also be referred to as an upper semiconductor package.

Here, the semiconductor package 100 may be substantially the same as the semiconductor package 100 described with reference to the at least one example embodiment associated with FIGS. 10 and 11, and the same descriptions are not repeatedly given.

The semiconductor package 200 may include a semiconductor chip 210, a package substrate 230, and/or a molding layer 250, etc., but is not limited thereto.

The package substrate 230 may include, for example, a PCB, etc. The package substrate 230 may include a substrate base 231 including phenol resins, epoxy resins, polyimide, etc. Also, the package substrate 230 may include upper pads 235 arranged on an upper surface of the substrate base 231 and/or lower pads 234 arranged on a lower surface of the substrate base 231. Lines 236 configured to be electrically connected to the upper pads 235 and/or the lower pads 234 may be formed in the substrate base 231. An upper protection layer 233 covering the upper surface of the substrate base 231 and exposing the upper pads 235 may be arranged on the upper surface of the substrate base 231, but the example embodiments are not limited thereto. A lower protection layer 232 covering the lower surface of the substrate base 231 and exposing the lower pads 234 may be arranged on the lower surface of the substrate base 231, but the example embodiments are not limited thereto.

The package substrate 230 may be mounted on and/or formed on the second rewiring structure 160 of the semiconductor package 100. The package substrate 230 may be connected to the second rewiring structure 160 through connection terminals 260 arranged on the second rewiring structure 160, etc. The connection terminals 260 may be connected to each of rewiring patterns 173 of the second rewiring structure 160 and/or the lower pads 234 of the package substrate 230 and may electrically connect the rewiring patterns 173 of the second rewiring structure 160 with the lower pads 234 of the package substrate 230, etc.

The semiconductor chip 210 may be arranged on the package substrate 230. For example, chip pads 215 of the semiconductor chip 210 may be electrically connected to the upper pads 235 of the package substrate 230 through connection terminals 220, such as a solder ball, a bump, etc. An under-fill layer 240 surrounding the connection terminals 220 may be arranged between the semiconductor chip 210 and/or the package substrate 230, etc.

According to some example embodiments, the semiconductor chip 140 and the semiconductor chip 210 may be heterogeneous semiconductor chips, but the example embodiments are not limited thereto, and for example, the semiconductor chips may be the same type of chip, etc. As one example, when the semiconductor chip 140 is a logic chip, the semiconductor chip 210 may be a memory chip, etc. According to some example embodiments, the semiconductor chip 210 may include a high bandwidth memory (HBM) chip, etc. According to some example embodiments, the semiconductor package 1000 may be configured such that components, such as heterogeneous types of semiconductor chips and passive devices, are electrically connected to one another and operate as a system, but the example embodiments are not limited thereto. According to some example embodiments, the semiconductor chip 140 and the semiconductor chip 210 may be homogeneous semiconductor chips.

The molding layer 250 may be arranged on the package substrate 230 to cover at least a portion of the semiconductor chip 210, but is not limited thereto. The molding layer 250 may include, for example, epoxy-based molding resins and/or polyimide-based molding resins, etc. For example, the molding layer 250 may include an epoxy molding compound, etc.

As discussed above, the semiconductor package 1000 including the semiconductor package 100 associated with the at least one example embodiment of FIG. 1 is described. However, the example embodiments are not limited thereto, and for example, the semiconductor package 101 associated with the at least one example embodiment of FIG. 12 and/or the semiconductor package 102 associated with the at least one example embodiment of FIG. 14, etc., may be provided, etc.

Figure 16:
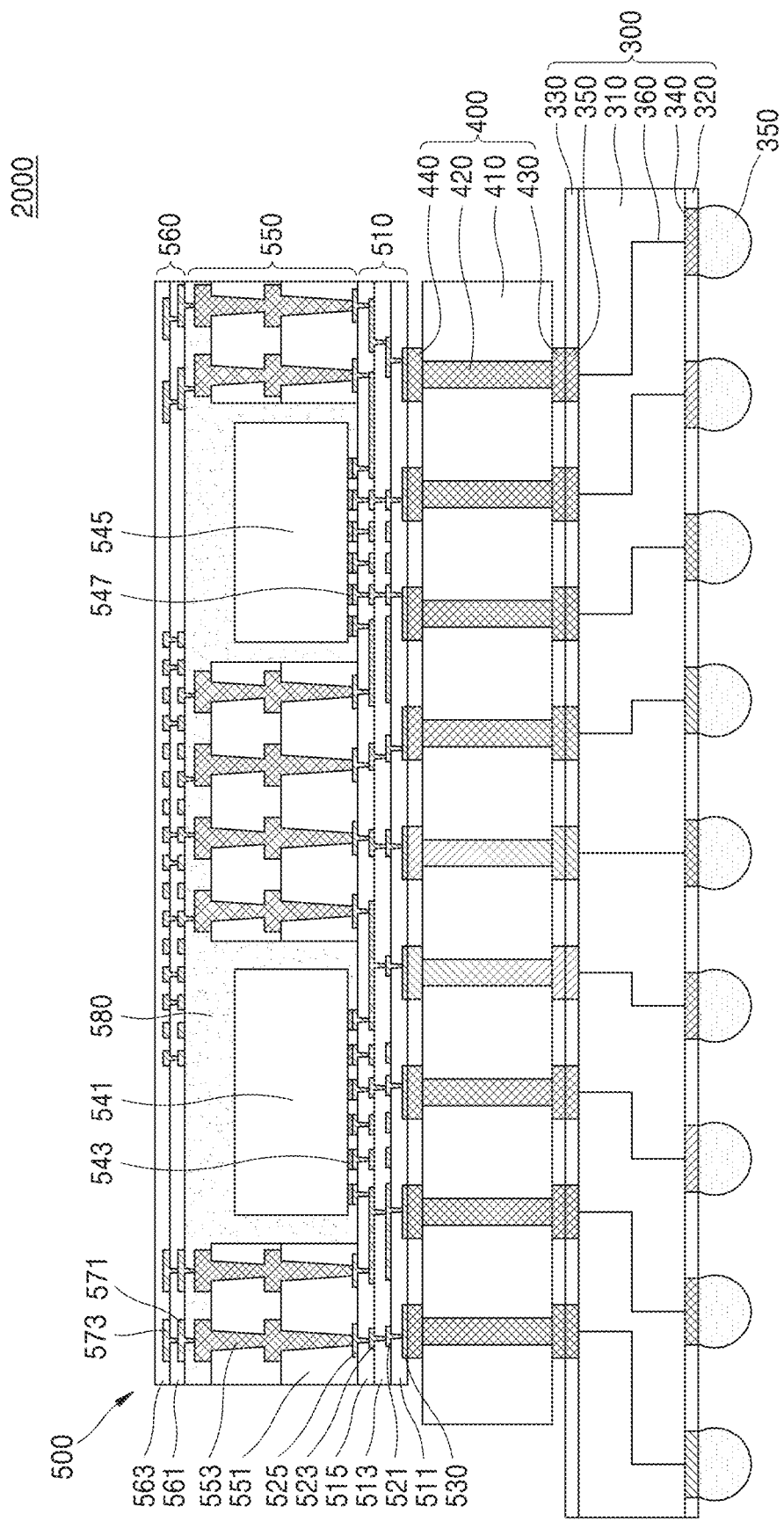
FIG. 16 is a cross-sectional view of a semiconductor package according to some other example embodiments.

FIG. 16 is a cross-sectional view of a semiconductor package 2000 according to some other example embodiments.

Referring to FIG. 16, the semiconductor package 1000 may include a package substrate 300, an interposer 400, and/or a semiconductor package 500, etc., but is not limited thereto, and for example, may include a greater or lesser number of constituent components.

The package substrate 300 may include, for example, a PCB, etc. The package substrate 300 may include a substrate base 310 including phenol resins, epoxy resins, polyimide, etc. Also, the package substrate 300 may include upper pads 350 arranged on an upper surface of the substrate base 310 and/or lower pads 340 arranged on a lower surface of the substrate base 310, but the example embodiments are not limited thereto. Lines 360 configured to be electrically connected to the upper pads 350 and/or the lower pads 340 may be formed in the substrate base 310, etc. An upper protection layer 330 covering the upper surface of the substrate base 310 and exposing the upper pads 350 may be arranged on the upper surface of the substrate base 310. A lower protection layer 320 covering the lower surface of the substrate base 310 and exposing the lower pads 340 may be arranged on the lower surface of the substrate base 310. The semiconductor package 2000 may further include external connection terminals 350 connected to the lower pads 340, but is not limited thereto.

The interposer 400 may be mounted and/or formed on the package substrate 300. The interposer 400 may be arranged between the semiconductor package 500 and the package substrate 300. The interposer 400 may include a substrate base 410, TSVs 420, lower pads 430, and/or upper pads 440, etc. The substrate base 410 may include, for example, an insulating material, such as phenol resins, epoxy resins, polyimide, etc.

The TSVs 420, the lower pads 430, and/or the upper pads 440 may include, for example, a conductive material, such as Cu, etc. The TSVs 420 may vertically (for example, in the Z direction) penetrate the substrate base 410. The TSVs 420 may provide electrical connection between the lower pads 430 and the upper pads 440, but are not limited thereto.

The lower pads 430 may be arranged on a lower surface of the substrate base 410, and the upper pads 440 may be arranged on an upper surface of the substrate base 410. The lower pads 430 may be connected to the upper pads 350 of the package substrate 300, and the upper pads 440 may be connected to lower pads 530 of a first rewiring structure 510, but the example embodiments are not limited thereto.

The semiconductor package 500 may include the first-rewiring structure 510, semiconductor chips 541 and 545, an intermediate connection structure 550, a second rewiring structure 560, and/or a molding layer 580, etc., but is not limited thereto.

The first rewiring structure 510 may include a plurality of insulating layers 511, 513, and 515, rewiring patterns 521, 523, and 525 formed in the plurality of insulating layers 511, 513, and 515, and/or a plurality of pads 530, etc.

The first rewiring structure 510 may be substantially the same as the first rewiring structure 110 described with reference to the at least one example embodiment associated with FIGS. 10 and 11, but is not limited thereto. Accordingly, the plurality of insulating layers 511, 513, and 515 may be substantially the same as the plurality of insulating layers 111, 113, and 115 (see, e.g., FIG. 10), the rewiring patterns 521, 523, and 525 may be substantially the same as the rewiring patterns 121, 123, and 125 (see, e.g., FIG. 10), and the plurality of pads 530 may be substantially the same as the plurality of pads 130 (see, e.g., FIG. 10), but are not limited thereto. Thus, the repeated descriptions are not given.

Likewise, the intermediate connection structure 550 may be substantially the same as the intermediate connection structure 150 of the at least one example embodiment associated with FIG. 10, but is not limited thereto. The intermediate connection structure 550 may include an insulating layer 551 and/or TSVs 553 penetrating the insulating layer 551, etc. The TSVs 553 may be configured to be electrically connected to the rewiring patterns 525 and/or the rewiring patterns 571, etc. The TSVs 553 may provide electrical connection between the first rewiring structure 510 and the second rewiring structure 560, but is not limited thereto.

The second rewiring structure 560 may be the same or substantially the same as the second rewiring structure 160 of the at least one example embodiment associated with FIG. 10, but is not limited thereto. The second rewiring structure 160 may include a plurality of insulating layers 561 and 563 and/or rewiring patterns 571 and 573, etc. According to some example embodiments, the second rewiring structure 560 may provide electrical connection with respect to the semiconductor chips 541 and 545, etc.

According to some example embodiments, the semiconductor chips 541 and 545 may be heterogeneous types of semiconductor chips, but are not limited thereto, and for example, may be the same type of semiconductor chip, etc. For example, each of the semiconductor chips 541 and 545 may be any one of a sensor chip, such as a temperature sensor, a pressure sensor, an acceleration sensor, and a gyroscope, a radio frequency (RF) chip, a micro-electromechanical system (MEMS) chip, a memory chip, and/or a logic chip, etc., but the example embodiments are not limited thereto.

The semiconductor chip 541 may be connected to the rewiring patterns 523 through chip pads 543, and the semiconductor chip 545 may be connected to the rewiring patterns 523 through chip pads 547, but are not limited thereto.

While various example embodiments of the inventive concepts have been particularly shown and described with reference to examples thereof, it will be understood that various changes in form and details may be made therein without departing from the spirit and scope of the following claims.

What is claimed is:

1. A semiconductor package comprising:
    at least one first rewiring structure, the at least one first rewiring structure including a plurality of first insulating layers vertically stacked and a plurality of first patterned rewiring layers included in the plurality of first insulating layers;
    at least one semiconductor chip on the at least one first rewiring structure; and
    at least one molding layer covering the at least one semiconductor chip,
    wherein each of the plurality of first patterned rewiring layers includes,
        a first patterned conductive layer, the first patterned conductive layer including a curved upper surface, and
        a first patterned seed layer covering a side surface and a lower surface of the first patterned conductive layer and having a conformal shape.

2. The semiconductor package of claim 1, wherein the curved upper surface of the first patterned conductive layer is concave.

3. The semiconductor package of claim 1, wherein the curved upper surface of the first patterned conductive layer has a decreasing height towards a midpoint of the first patterned conductive layer.

4. The semiconductor package of claim 1, wherein each of the plurality of first patterned rewiring layers includes:
    a first trace portion horizontally extending; and
    a first via portion vertically extending from the first trace portion, the first via portion including a curved lower surface.

5. The semiconductor package of claim 4, wherein the curved lower surface of the first via portion is convex.

6. The semiconductor package of claim 1, further comprising:
    at least one intermediate connection structure, the at least one intermediate connection structure located horizontal to the at least one semiconductor chip,
    the intermediate connection structure including,
        at least one insulating layer, and
        a plurality of through-silicon vias (TSVs) connected to corresponding first patterned rewiring layers from among the plurality of first patterned rewiring layers through the insulating layer.

7. The semiconductor package of claim 6, further comprising:
    at least one second rewiring structure including a plurality of second insulating layers vertically stacked and a plurality of second patterned rewiring layers included in the plurality of second insulating layers, wherein the intermediate connection structure is between the second rewiring structure and the first rewiring structure.

8. The semiconductor package of claim 7, wherein each of the plurality of second patterned rewiring layers includes:
    at least one second patterned conductive layer; and
    at least one second patterned seed layer covering a side surface and a lower surface of the at least one second patterned conductive layer, each of the at least one second patterned seed layer having a same shape, and the at least one second patterned seed layer including a concave upper surface.

9. The semiconductor package of claim 8, wherein the concave upper surface of the second patterned conductive layer having a decreasing height toward a midpoint of the second patterned conductive layer.

10. The semiconductor package of claim 7, wherein each of the plurality of second patterned rewiring layers includes:
    a horizontal second trace portion; and
    a second via portion, the second via portion extended vertically from the horizontal second trace portion, the second via portion including a convex lower surface.

11. A semiconductor package comprising:
    at least one first rewiring structure including a plurality of first insulating layers stacked in a first direction and a plurality of first patterned rewiring layers included in the plurality of first insulating layers;
    at least one semiconductor chip on the at least one first rewiring structure; and
    at least one second rewiring structure apart from the first rewiring structure in the first direction with the at least one semiconductor chip therebetween, the at least one second rewiring structure including a plurality of second insulating layers stacked in the first direction and a plurality of second patterned rewiring layers included in the plurality of second insulating layers, and
    each of the plurality of second patterned rewiring layers includes,
        at least one second patterned conductive layer, and
        at least one second patterned seed layer covering a side surface and a lower surface of the second patterned conductive layer and having a conformal shape.

12. The semiconductor package of claim 11, wherein the curved upper surface of the second patterned conductive layer has a decreasing height toward a midpoint of the second patterned conductive layer.

13. The semiconductor package of claim 11, wherein each of the plurality of second patterned rewiring layers includes:
    at least one horizontal second trace portion; and
    at least one second via portion extended vertically from the horizontal second trace portion, the second via portion including a convex lower surface.

14. The semiconductor package of claim 11, further comprising:
    at least one insulating layer between the at least one first rewiring structure and the at least one second rewiring structure, the at least one insulating layer horizontal to the at least one semiconductor chip; and
    a plurality of through-silicon vias (TSVs) configured to provide an electrical connection between the plurality of first and second rewiring structures through the plurality of insulating layers.

15. The semiconductor package of claim 11, further comprising:
- at least one molding layer covering the at least one semiconductor chip and the at least one first rewiring structure; and
- a plurality of conductive posts connected to the plurality of first patterned rewiring layers and the plurality of second patterned rewiring layers through the at least one molding layer.

16. A semiconductor package comprising:
- a plurality of first through third insulating layers sequentially stacked in a first direction;
- a plurality of first patterned rewiring layers, each of the plurality of first patterned rewiring layers including a first via portion and a first trace portion, the first via portion arranged through the first insulating layer in the first direction, and the first trace portion on the respective first insulating layer;
- a plurality of second patterned rewiring layers, the plurality of second patterned rewiring layers each including a second via portion and a second trace portion, the second via portion arranged through the second insulating layer in the first direction, and the second trace portion on the respective second insulating layer;
- a plurality of third patterned rewiring layers each including a third via portion connected to the second trace portion through the third insulating layer, and a third trace portion on the third insulating layer; and
- at least one semiconductor chip electrically connected to at least one of the plurality of third patterned rewiring layers, wherein each of the first patterned rewiring layers includes,
- a first patterned conductive layer, the first patterned conductive layer including a concave upper surface, and
- a first patterned seed layer covering a side surface and a lower surface of the first patterned conductive layer and having a conformal shape, each of the second patterned rewiring layers includes,
- a second patterned conductive layer, the second patterned conductive layer including a concave upper surface, and
- a second patterned seed layer covering a side surface and a lower surface of the second patterned conductive layer, each of the second patterned seed layers having a same shape, and each of the third patterned rewiring layers includes,
- a third patterned conductive layer, the third patterned conductive layer including a concave upper surface, and
- a third patterned seed layer covering a side surface and a lower surface of the third patterned conductive layer, each of the third patterned seed layers having a same shape.

17. The semiconductor package of claim 16, wherein
the second via portion of each of the second patterned rewiring layers includes a concave curved lower surface; and
the third via portion of each of the third patterned rewiring layers includes a concave curved lower surface.

18. The semiconductor package of claim 16, wherein the upper surface of each of the first through third patterned conductive layers is further recessed toward a respective center thereof.

19. The semiconductor package of claim 16, wherein the first via portion of each of the first patterned rewiring layers includes a flat lower surface.

20. The semiconductor package of claim 16, further comprising:
- at least one intermediate connection structure horizontal to the at least one semiconductor chip, and
- the at least one intermediate connection structure includes,
  - an insulating layer and
  - a plurality of through-silicon vias (TSVs) connected to corresponding third patterned rewiring layers from among the plurality of third patterned rewiring layers through the insulating layer.

* * * * *